(12) United States Patent
Hamada et al.

(10) Patent No.: US 8,395,302 B2
(45) Date of Patent: *Mar. 12, 2013

(54) PIEZOELECTRIC MATERIAL AND PIEZOELECTRIC ELEMENT

(75) Inventors: Yasuaki Hamada, Suwa (JP); Takeshi Kijima, Saitama (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/328,302

(22) Filed: Dec. 16, 2011

(65) Prior Publication Data

US 2012/0086758 A1    Apr. 12, 2012

Related U.S. Application Data

(63) Continuation of application No. 12/413,796, filed on Mar. 30, 2009, now Pat. No. 8,102,100.

(30) Foreign Application Priority Data

Apr. 1, 2008   (JP) ................................. 2008-095054

(51) Int. Cl.
*H01L 41/09* (2006.01)

(52) U.S. Cl. .................. 310/358; 252/62.9 PZ

(58) Field of Classification Search .......... 310/358, 310/357, 311, 366, 365; 252/62.9 PZ; *H01L 41/09, H01L 41/08*
See application file for complete search history.

(56) References Cited

U.S. PATENT DOCUMENTS

| 7,808,161 B2 * | 10/2010 | Yamazaki et al. ............ 310/358 |
| 7,906,889 B2 * | 3/2011 | Furuta et al. .................. 310/358 |
| 8,102,100 B2 * | 1/2012 | Hamada et al. ............... 310/358 |
| 2003/0146287 A1 * | 8/2003 | Maruyama .................... 235/492 |
| 2009/0140197 A1 * | 6/2009 | Aoki et al. ............. 252/62.9 PZ |
| 2011/0074564 A1 * | 3/2011 | Hirabayashi et al. ......... 340/447 |

FOREIGN PATENT DOCUMENTS

| JP | 62-85419 | 4/1987 |
| JP | 2002-084012 | 3/2002 |
| JP | 2003-233537 | 8/2003 |
| JP | 2004-6722 | 1/2004 |
| JP | 2007-221066 | 8/2007 |
| JP | 2007-266346 | 10/2007 |
| JP | 2007-287745 | 11/2007 |

\* cited by examiner

*Primary Examiner* — Thomas Dougherty
*Assistant Examiner* — Karen B Addison
(74) *Attorney, Agent, or Firm* — Harness, Dickey & Pierce, P.L.C.

(57) ABSTRACT

A piezoelectric element includes a first electrode, a piezoelectric film disposed on the first electrode, and a second electrode disposed on the piezoelectric film. The piezoelectric film is composed of piezoelectric material that is lead free and formed by mixing $100(1-x)$ % of material A having a spontaneous polarization of 0.5 C/m2 or greater at 25° C. and $100x$ % of material B having piezoelectric characteristics and a dielectric constant of 1000 or greater at 25° C., wherein $(1-x)Tc(A)+x\ Tc(B) \geq 300°$ C., where $Tc(A)$ is the Curie temperature of the material A and $Tc(B)$ is the Curie temperature of the material B.

9 Claims, 18 Drawing Sheets

| Bi(Fe$_{1-y}$Mn$_y$)O$_3$ | | | |
|---|---|---|---|
| Sample | y | Hysteresis Characteristics | Reference Figure |
| No.1 | 0 | × (Short-circuit) | — |
| No.2 | 0.01 | × (Leaky) | FIG. 2A |
| No.3 | 0.02 | ○ | FIG. 2B |
| No.4 | 0.03 | ○ | FIG. 2C |
| No.5 | 0.04 | ○ | FIG. 2D |
| No.6 | 0.05 | ○ | FIG. 3A |
| No.7 | 0.06 | △ (Slightly leaky) | FIG. 3B |
| No.8 | 0.07 | △ (Slightly leaky) | FIG. 3C |
| No.9 | 0.1 | × (Leaky) | FIG. 3D |

| Bi(Fe$_{1-y}$Mn$_y$)O$_3$ | | | |
|---|---|---|---|
| Sample | y | Hysteresis Characteristics | Reference Figure |
| No.1 | 0 | ✗ (Short-circuit) | — |
| No.2 | 0.01 | ✗ (Leaky) | FIG. 2A |
| No.3 | 0.02 | ○ | FIG. 2B |
| No.4 | 0.03 | ○ | FIG. 2C |
| No.5 | 0.04 | ○ | FIG. 2D |
| No.6 | 0.05 | ○ | FIG. 3A |
| No.7 | 0.06 | △ (Slightly leaky) | FIG. 3B |
| No.8 | 0.07 | △ (Slightly leaky) | FIG. 3C |
| No.9 | 0.1 | ✗ (Leaky) | FIG. 3D |

| (1-x)Bi(Fe$_{0.95}$Mn$_{0.05}$)O$_3$/xBaTiO$_3$ | | | |
|---|---|---|---|
| Sample | x | Hysteresis Characteristics | Reference Figure |
| No.10 | 0 | ○ | FIG. 5A |
| No.11 | 0.1 | ○ | FIG. 5B |
| No.12 | 0.2 | ○ | FIG. 5C |
| No.13 | 0.3 | △ (Slightly leaky) | FIG. 5D |
| No.14 | 0.4 | ✕ (Low Pm, Leaky) | FIG. 6A |
| No.15 | 0.5 | ✕ (Low Pm, Leaky) | FIG. 6B |

FIG. 4

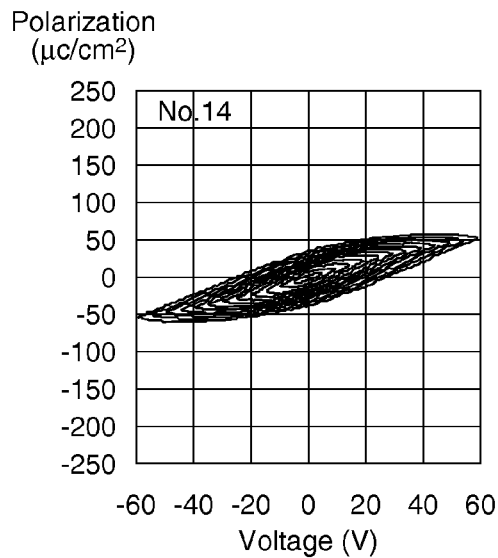
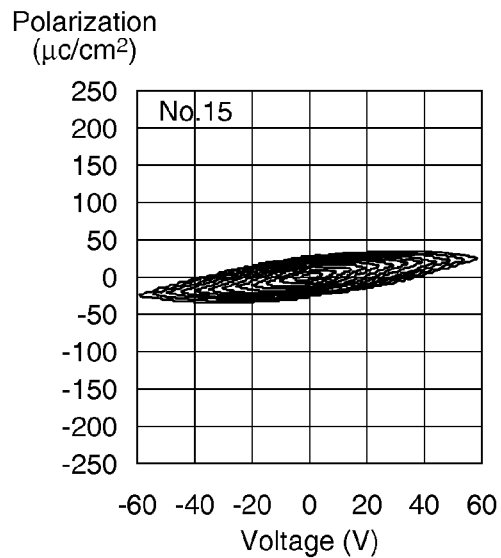
FIG. 6A                FIG. 6B
| Sample | x | $d_{33}$(pm/V) |
|---|---|---|
| No.10 | 0 | 46.5 |
| No.11 | 0.1 | 60.7 |
| No.12 | 0.2 | 64.8 |
FIG. 7

| 0.8Bi(Fe$_{0.95}$Mn$_{0.05}$)O$_3$/0.2Ba(Zr$_u$Ti$_{1-u}$)O$_3$ | | | |
|---|---|---|---|
| Sample | u | Hysteresis Characteristics | Reference Figure |
| No.16 | 0 | ○ | FIG. 9A |
| No.17 | 0.04 | ○ | FIG. 9B |
| No.18 | 0.08 | ○ | FIG. 9C |
| No.19 | 0.12 | ○ | FIG. 9D |

FIG. 8

| Sample | u | $d_{33}$(pm/V) |
|---|---|---|
| No.17 | 0.04 | 55.2 |
| No.18 | 0.08 | 56.5 |
| No.19 | 0.12 | 57.4 |

FIG. 10

| Sample | x | y | Heat Resisting Temperature (°C) | Curie Temperature (°C) |
|---|---|---|---|---|
| No.4 | 0 | 0.03 | 150 | At least 150°C or higher |
| No.5 | 0 | 0.04 | 150 | At least 150°C or higher |
| No.6 | 0 | 0.05 | 100 | At least 100°C or higher |
| No.7 | 0 | 0.06 | 100 | At least 100°C or higher |
| No.8 | 0 | 0.07 | 100 | At least 100°C or higher |
| No.11 | 0.1 | 0.05 | 200 | At least 200°C or higher |
| No.12 | 0.2 | 0.05 | 225 | At least 225°C or higher |

PIEZOELECTRIC MATERIAL AND PIEZOELECTRIC ELEMENT

CROSS-REFERENCE TO RELATED APPLICATIONS

This is a continuation application of U.S. Ser. No. 12/413,796 filed Mar. 30, 2009, which claims priority to Japanese Patent Application No. 2008-095054 filed Apr. 1, 2008 which is hereby expressly incorporated by reference herein in its entirety.

BACKGROUND

1. Technical Field

The present invention relates to piezoelectric materials that are used for piezoelectric elements.

2. Related Art

Piezoelectric elements possess a characteristic in which crystals are charged when they are deformed, or they are deformed when they are placed in an electric filed. As such, they are commonly used for liquid jet apparatuses such as ink jet printers.

Piezoelectric thin films such as PZT (lead titanate zirconate: $Pb(Zr_xTi_{1-x})O_3$) films have been widely used for such piezoelectric elements.

Unfortunately, PZT films contain lead (Pb), and therefore could pose problems for the safety of operators and the environment. Accordingly, research and development regarding lead free piezoelectric materials are being extensively conducted. For example, Japanese Laid-open Patent Applications JP-A-2004-6722, JP-A-2007-266346 and JP-A-2007-287745 describe lead free piezoelectric materials.

Among the aforementioned piezoelectric elements, thin film piezoelectric elements in which a thin film piezoelectric layer is sandwiched between electrodes have been studied and developed in recent years. Thin film piezoelectric elements are generally formed by a process in which a piezoelectric layer having a film thickness of several μm or less is formed on an electrode that is formed on a substrate, and an upper electrode is formed on the piezoelectric layer. This process is conducted through micro-processing that is similar to a semiconductor process. Therefore, thin film piezoelectric elements have an advantage in that piezoelectric elements can be formed at a higher density than ordinary piezoelectric elements.

Although PZT is often used as the piezoelectric material for thin film piezoelectric elements, the use of lead free piezoelectric materials is now also being considered.

In fact, the inventors of the present invention have been conducting research and development on piezoelectric materials, and examining the application of lead free piezoelectric materials and the improvement of lead free piezoelectric material characteristics.

$BaTiO_3$ and a variety of materials containing Bi may be representative examples of lead free piezoelectric materials. $BaTiO_3$ has a large piezoelectric constant but has a low Curie temperature of about 120° C., and thus has a problem with temperature stability. Many of the materials containing Bi have a high Curie temperature, but many of them have certain problems, such as a small dielectric constant and a small spontaneous polarization, as well as problems in temperature stability due to the phase transfer temperature being lower than the Curie temperature. Thus, although lead free piezoelectric materials are being widely studied and developed as described above, in reality they have both advantages and disadvantages.

Other problems that may be encountered when using lead free piezoelectric materials for thin film piezoelectric elements include a compositional shift due to the fallout of alkali metal elements in materials containing such alkali metal elements, and diffusion into lower electrode layers due to the high temperature crystallization necessary for $BaTiO_3$. In either case, it is difficult to use these materials for thin film piezoelectric elements.

$BiFeO_3$ has a high Curie temperature and a large spontaneous polarization, and also has many other advantages suitable for thin film formation. For example, $BiFeO_3$ does not have elements that would likely cause compositional shift, such as alkali metal elements, and has a lower crystallization temperature, such that $BiFeO_3$ is attracting attention as a material for ferroelectric memories. Thus, attempts to use $BiFeO_3$ as piezoelectric material have also been made in recent years. However, $BiFeO_3$ has a small dielectric constant, and thus cannot be expected to achieve a high piezoelectric constant as a stand alone material.

In view of the foregoing, there has been a study to increase the piezoelectric constant by mixing crystals of $BiFeO_3$ and $BaTiO_3$. However, when $BaTiO_3$ is mixed too much, $BaTiO_3$ becomes dominant and as a result the high Curie temperature and large spontaneous polarization of $BiFeO_3$ cannot be best used. Also, if piezoelectric elements are manufactured independently with either of the materials, $BiFeO_3$ would likely result in a poor dielectric property, and $BaTiO_3$ would deteriorate the piezoelectric characteristics since it is difficult to make its composition uniform, and thus would likely form layers with a lower dielectric constant. Therefore it is necessary to devise a solution for controlling the shortcomings of the respective materials, and to select appropriate mixing ratios.

SUMMARY

In accordance with some aspects of the invention, it is possible to provide $BiFeO_3$ and $BaTiO_3$ based piezoelectric materials that are lead free and easy to prepare, yet still provide a large piezoelectric constant and a high Curie temperature.

In accordance with an embodiment of the invention, a piezoelectric element includes a first electrode, a piezoelectric film disposed on the first electrode, and a second electrode disposed on the piezoelectric film, wherein the piezoelectric film is composed of a piezoelectric material that is lead free and a mixture of 100(1−x) % material A having a spontaneous polarization of 0.5 $C/m^2$ or greater at 25° C., and 100 x % material B having piezoelectric characteristics and a dielectric constant of 1000 or greater at 25° C., wherein (1−x)Tc(A)+x Tc(B)≧300° C. where Tc(A) is the Curie temperature of the material A and Tc(B) is the Curie temperature of the material B.

According to the composition described above, the film performance can be improved by the spontaneous polarization of the material A, and a high Curie temperature can be maintained. Furthermore, the piezoelectric characteristics can be improved by the material B.

In accordance with another embodiment of the invention, a piezoelectric element includes a first electrode, a piezoelectric film disposed on the first electrode, and a second electrode disposed on the piezoelectric film, wherein the piezoelectric film is composed of mixed crystals of $Bi(Fe, Mn)O_3$ and $Ba(Zr, Ti)O_3$, expressed by a compositional formula of $(1-x)Bi(Fe_{1-y}Mn_y)O_3-xBa(Zr_uTi_{1-u})O_3$, where $0<x<0.40$, $0.01<y<0.10$, and $0≦u<0.16$.

According to the composition described above, the piezoelectric characteristics can be improved by $Ba(Zr_uTi_{1-u})O_3$ while maintaining the spontaneous polarization and high Curie temperature of $Bi(Fe_{1-y}Mn_y)O_3$. In this manner, when the composition is within the range described above, the mixed materials preferentially exhibit their respective characteristics that are useful as a piezoelectric material, whereby the film characteristics can be improved.

The first electrode or the second electrode may be formed from a single layer of metal or conductive oxide, or a laminate of layers of the aforementioned metal and conductive oxide. For example, the first electrode and the second electrode may be formed from any one of Pt, Ir, Au, Ti, Zr, Fe, Mn, Ni, Co, $IrO_2$, $Nb:SrTiO_3$, $La:SrTiO_3$, $SrRuO_3$, $LaNiO_3$, $(La, Sr)FeO_3$, and $(La, Sr)CoO_3$, or a laminate of layers of selected ones of the aforementioned materials. The aforementioned materials may be used for the first electrode or the second electrode.

The first electrode, the piezoelectric material film and the second electrode may be formed on a base substrate. For example, the base substrate may be formed from a semiconductor material, metal, ceramic or glass. Also, for example, the material composing the base substrate may have a melting point or a glass transition point of 650° C. or higher. Any of the aforementioned materials can be used for a base substrate on which piezoelectric elements are formed.

BRIEF DESCRIPTION OF THE DRAWINGS

FIG. 4 is a table showing the pass and fail results of the hysteresis characteristics of samples No. 10-No. 15 whose composition ratios x are adjusted, respectively.

FIGS. 6A-6B are graphs showing the hysteresis characteristics of samples No. 14-No. 15.

FIG. 7 is a table showing the piezoelectric constant ($d_{33}$ [pm/V]) of each of samples No. 10-No. 12.

FIG. 8 is a table showing the pass and fail results of the hysteresis characteristics of samples No. 16-No. 19 whose composition ratios u are adjusted, respectively.

FIG. 10 is a table showing the piezoelectric constants ($d_{33}$ [pm/V]) of samples No. 16-No. 19.

DESCRIPTION OF EXEMPLARY EMBODIMENTS

Preferred embodiments of the invention are described in detail below with reference to the accompanying drawings. It is noted that components having the same function shall be appended with the same or relating reference numbers and their description shall not be repeated.

Embodiment 1

Figures 1A, 1B:
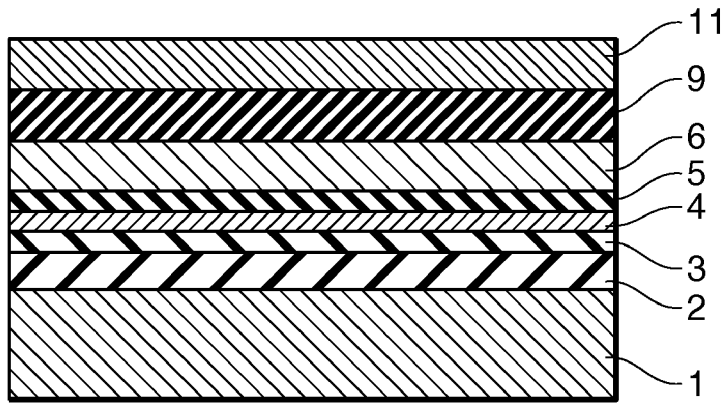
FIG. 1A is a cross-sectional view showing a step of a method for forming a piezoelectric material in accordance with embodiment 1 of the invention.
FIG. 1B is a table showing the pass and fail results of the hysteresis characteristics of samples No. 1-No. 9 whose composition ratios y are adjusted, respectively.
Figure 2A:
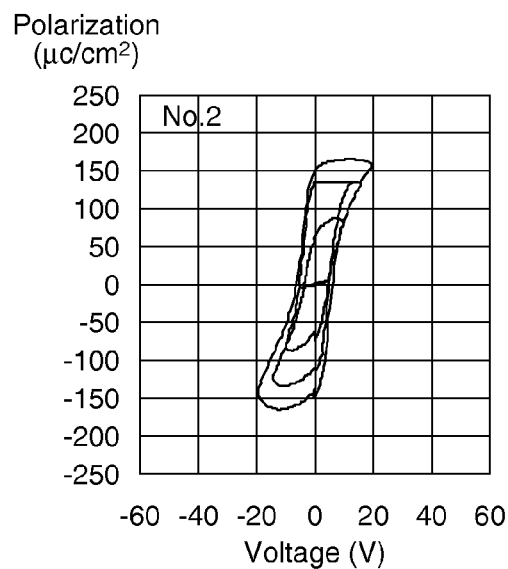
FIGS. 2A-2D are graphs showing the hysteresis characteristics of samples No. 2-No. 5.
Figure 2B:
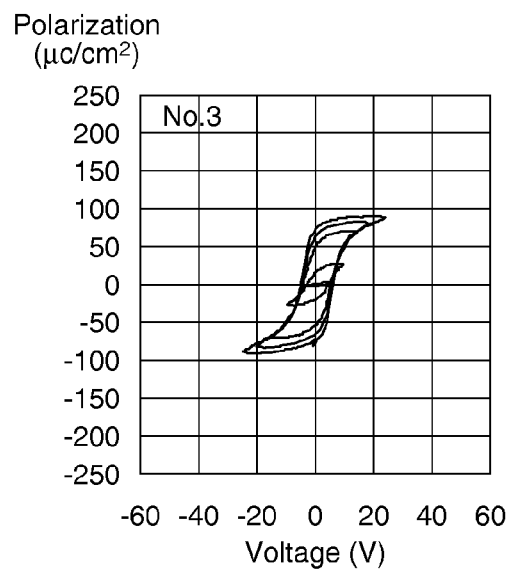
Figure 2C:
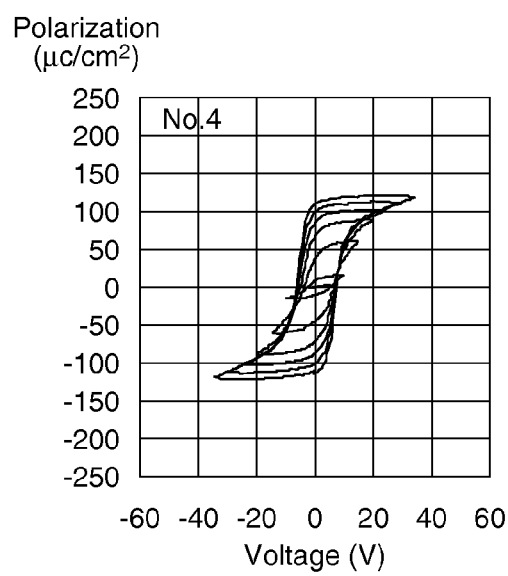
Figure 2D:
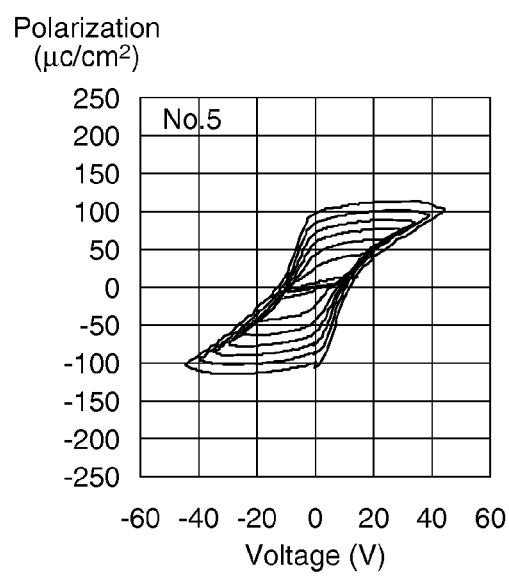
Figure 3A:
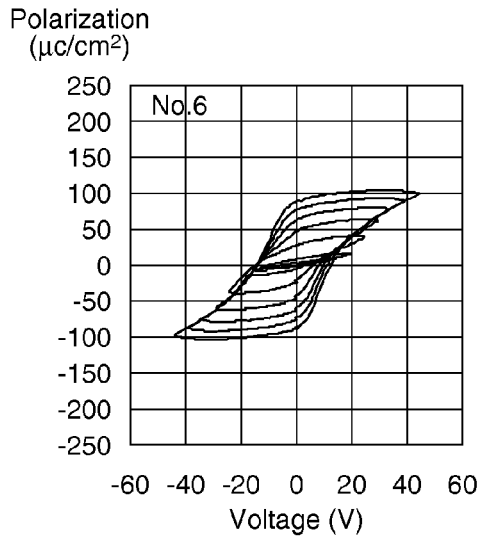
FIGS. 3A-3D are graphs showing the hysteresis characteristics of samples No. 6-No. 9.
Figure 3B:
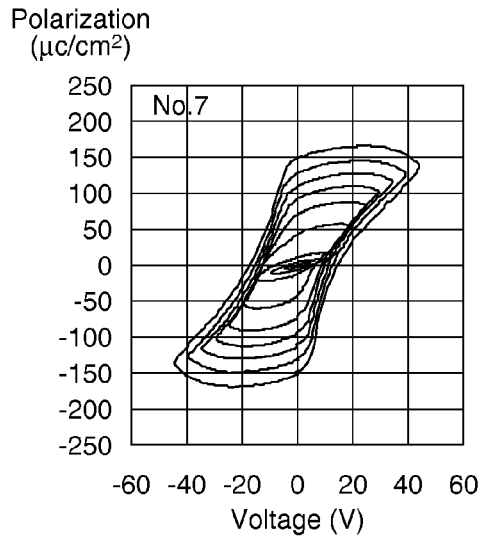
Figure 3C:
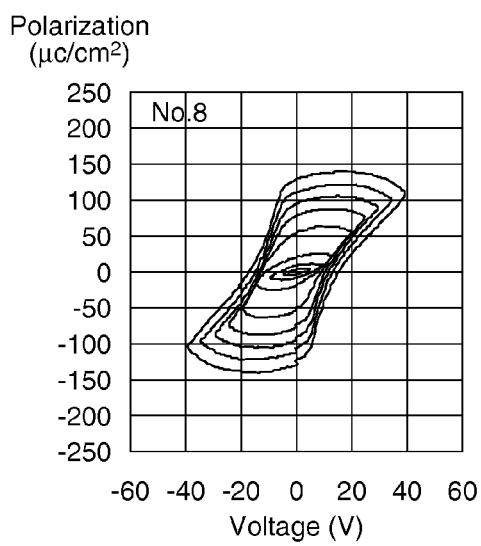
Figure 3D:
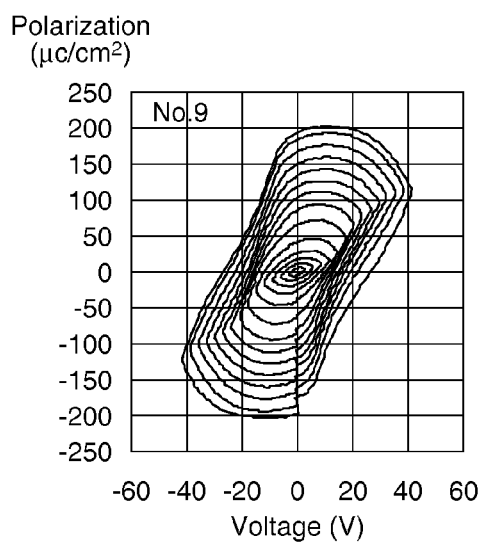
Figure 5A:
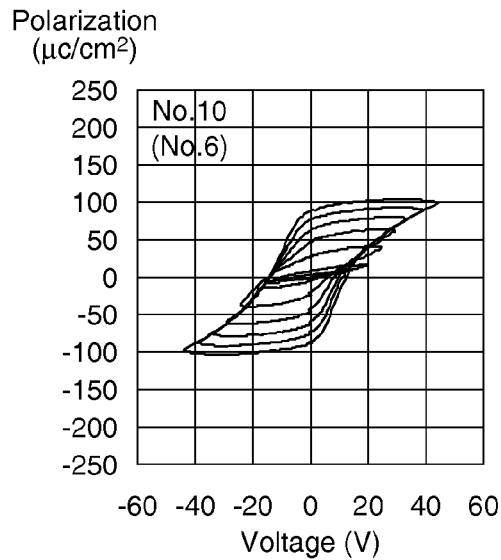
FIGS. 5A-5D are graphs showing the hysteresis characteristics of samples No. 10-No. 13.
Figure 5B:
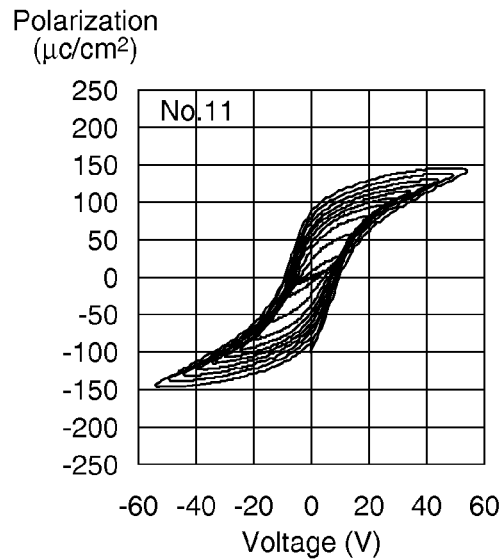
Figure 5C:
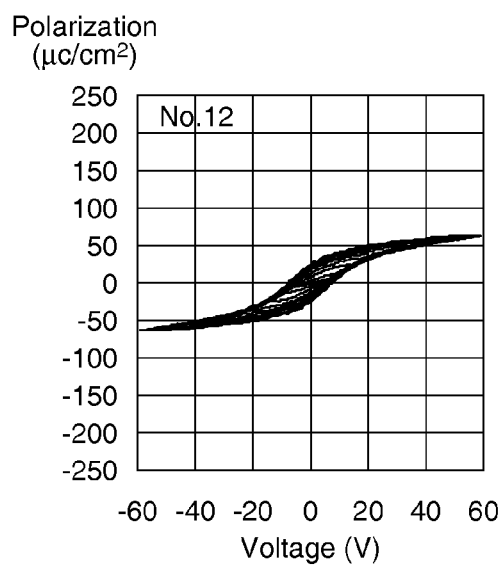
Figure 5D:
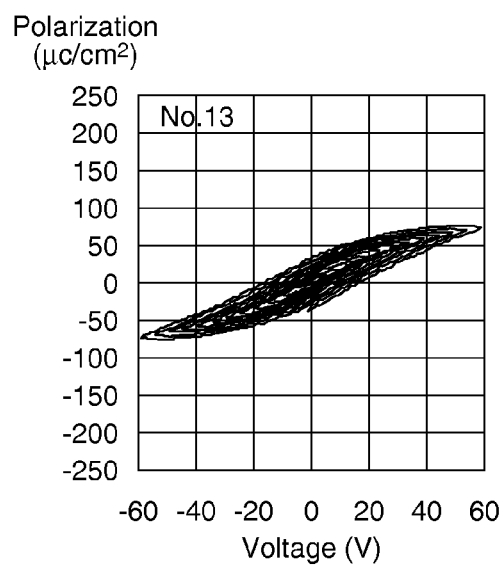

FIG. 1A is a cross-sectional view showing a step of a method for forming piezoelectric material in accordance with an embodiment of the invention. First, as shown in FIG. 1A, a substrate 1, such as, for example, a silicon (Si) substrate is prepared, and an elastic film (vibration plate) 2, such as, a silicon oxide film is formed on the surface of the substrate 1. The silicon oxide film may be formed by, for example, thermal oxidation to a film thickness of about 400 nm.

Then, on the elastic film 2, a TiAlN (titanium aluminum nitride) film 3 is formed by, for example, a RF sputter method to a film thickness of about 100 nm. Next, an Ir (iridium) film 4 is formed by a DC sputter method on the TiAlN film 3 to a film thickness of about 100 nm, and then an iridium oxide (IrO) film 5 is further formed thereon by a DC sputter method. The laminated films function as an adhesion layer between the silicon oxide film and the lower electrode, or function as a diffusion prevention layer.

Next, a lower electrode 6 composed of a conductive film, such as, for example, a platinum (Pt) film is formed on the iridium oxide film 5. The Pt film may be deposited by, for example, a DC sputter method to a thickness of about 100 nm.

Then, a dielectric film (a dielectric film, a capacitance insulation film, a piezoelectric film) 9 is formed on the lower electrode 6. The dielectric film 9 may be formed through coating a solution (source material solution) in which compounds (organometallic compounds) of constituent metals of $Bi(Fe, Mn)O_3$ and $Ba(Zr, Ti)O_3$ are dissolved in a solvent on the substrate by an appropriate coating method, such as, a spin coat method, and heat treating (drying, cleaning and sintering) the coated film.

Embodiment Example 1

For example, a source material solution of $Bi(Fe_{1-y}Mn_y)O_3$ adjusted to have an oxide concentration of 0.165 mol/kg is coated on a Pt film 6 by a spin coat method at 1500 rpm, thereby forming a precursor film. Then, the film is heat treated at 350° C. for three minutes, thereby drying and cleaning the film. The cleaning is conducted to thermally decompose organic compositions remaining in the precursor film into $NO_2$, $CO_2$, $H_2O$ and the like, and to remove them. The coating, drying and cleaning steps are repeated ten times, and then sintering (heat treatment) is conducted at 650° C. for ten minutes by using a lamp anneal furnace, thereby forming a $Bi(Fe_{1-y}Mn_y)O_3$ film (the film 9) having a film thickness of about 400 nm. It is noted that the oxide concentration means a concentration of $Bi(Fe_{1-y}Mn_y)O_3$ that is an oxide in this case.

Then, on the $Bi(Fe_{1-y}Mn_y)O_3$ film (9), a conductive film, such as, for example, a Pt film is deposited by a DC sputter method to a thickness of about 100 nm to form an upper electrode 11, whereby a structure (a capacitor structure, a piezoelectric element structure) in which the $Bi(Fe_{1-y}Mn_y)O_3$ film (9) is sandwiched by the upper electrode 11 and the lower electrode 6 is formed.

Structures (see FIG. 1A) were formed with the conditions described above, using source material solutions of $Bi(Fe_{1-y}Mn_y)O_3$ with the value y in a $Bi(Fe_{1-y}Mn_y)O_3$ film (9) being adjusted in the range between 0 and 0.1, and their dielectric characteristics were examined.

FIG. 1B is a table showing the pass and fail results of the hysteresis characteristics of samples No. 1-No. 9 whose composition ratios y were adjusted, respectively. FIGS. 2A-2D and FIGS. 3A-3D are graphs showing the hysteresis characteristics of the samples. Amounts of polarization ($\mu C/cm^2$) are plotted along the axis of ordinates, and voltage values (V) are plotted along the axis of abscesses. The hysteresis characteristics were obtained by triangle waves at a frequency of 1 kHz.

As shown in FIG. 1B through FIG. 3D, it is clear that sample No. 1 with y=0 causes short-circuiting and therefore cannot be used as a dielectric film. Also, it is understood that sample No. 2 with y=0.01 and sample No. 9 with y=0.1 are leaky (have large current leak components) and therefore cannot be used as dielectric films. Also, it is observed that sample No. 7 with y=0.06 and sample No. 8 with y=0.07 tend to be leaky. On the other hand, the samples with y being in the range between 0.02 and 0.05 obtained excellent hysteresis characteristic (dielectric characteristic).

Accordingly, it is understood that, as the content of Mn, the range of 0.01<y<0.1 may be preferable, the range of $0.02 \leq y \leq 0.07$ may be more preferable, and the range of $0.02 \leq y \leq 0.05$ may be even more preferable.

Embodiment Example 2

In this embodiment example, structures (see FIG. 1A) described above were formed by a process similar to that of Embodiment Example 1, using a source material solution in which the value x in films of $(1-x)Bi(Fe_{1-y}Mn_y)O_3-xBa)Zr_uTi_{1-u})O_3$ was adjusted in the range between 0 and 0.5, and the dielectric characteristics of the structures were examined. It is noted that the value y and the value u were fixed at y=0.05 and u=0. In other words, mixed crystals of $Bi(Fe, Mn)O_3$ and $Ba(Ti)O_3$ were formed using a source material solution of $(1-x)Bi(Fe_{0.95}Mn_{0.05})O_3-xBa\,TiO_3$.

FIG. 4 is a table showing the pass and fail results of the hysteresis characteristics of samples No. 10-No. 15 whose composition ratios x were adjusted, respectively. FIGS. 5A-5D and FIGS. 6A-6B are graphs showing the hysteresis characteristics of the samples, respectively. It is noted that sample No. 10 is the same as sample No. 6.

As shown in FIG. 4 through FIG. 6B, it is clear that samples No. 14 and No. 15 with x=0.4 and x=0.5, respectively, are leaky, and therefore cannot be used as dielectric films. Also, these samples exhibited lower Pm. Pm is polarization that is caused upon application of a predetermined voltage (in this example, 60V). Also, it was observed that sample No. 13 with x=0.3 had a leaky tendency. On the other hand, when the value of x was in the range of 0-0.2, excellent hysteresis characteristics (dielectric characteristics) could be obtained.

Accordingly, it is understood that, as the mixing ratio for $(1-x)Bi(Fe, Mn)O_3$ and $xBa(Zr, 0Ti)O_3$, the range of 0<x<0.4 may be preferable, the range of $0<x \leq 0.3$ may be more preferable, and the range of $0<x \leq 0.2$ may be even more preferable.

Next, the piezoelectric characteristics of samples No. 10-No. 12 were measured. FIG. 7 is a table showing the piezoelectric constants ($d_{33}$/(pm/V)) of the respective samples. It is noted that the piezoelectric constant (piezoelectric strain constant) d may be expressed by a formula $Si=dij \times Ei$, where S is the amount of strain and E is an electric field. It is noted that i in the formula is the direction of strain, and j is the voltage application direction. The smaller the piezoelectric constant d, the larger the strain of a piezoelectric film. It is noted that $d_{33}$ is a piezoelectric strain constant given, upon application of an electric field E3 in a direction, when a strain S3 is generated in a direction parallel with the foregoing direction. For example, $d_{31}$ is a piezoelectric strain constant given, upon application of an electric field E3, when a strain 51 is generated in a direction orthogonal to the foregoing direction. It is noted that the numbers "1," "2" and "3" mean the x-axis direction, the y-axis direction and the z-axis direction, respectively. The piezoelectric constants $d_{33}$ were measured by using a double beam laser Doppler method.

As shown in FIG. 7, the piezoelectric constant improved when $Ba(Ti)O_3$ was mixed (with x=0.1, x=0.2), than the case without mixing $Ba(Ti)O_3$(x=0). Also, the piezoelectric constant was greater when the mixing ratio was at x=0.2 than when it was at x=0.1.

Embodiment Example 3

In this embodiment example, structures (see FIG. 1A) described above were formed by a process similar to that of Embodiment Example 1, using a source material solution of $(1-x)Bi(Fe_{1-y}Mn_y)O_3-xBa(Zr_uTi_{1-u})O_3$ in which the value u in the films was adjusted in the range between 0 and 0.12, and the dielectric characteristics of the structures were examined. It is noted that the value x and the value y were fixed at x=0.2 and y=0.05. In other words, mixed crystals of $Bi(Fe, Mn)O_3$ and $Ba(Zr, Ti)O_3$ were formed using a source material solution of $0.8\,Bi(Fe_{0.95}Mn_{0.05})O_3-0.2Ba(Zr_uTi_{1-u})O_3$.

FIG. 8 is a table showing the pass and fail results of the hysteresis characteristics of samples No. 16-No. 19 whose composition ratios u were adjusted, respectively. FIGS. 9A-9D are graphs showing the hysteresis characteristics of the samples, respectively. It is noted that sample No. 16 is the same as sample No. 12.

Figure 9A:
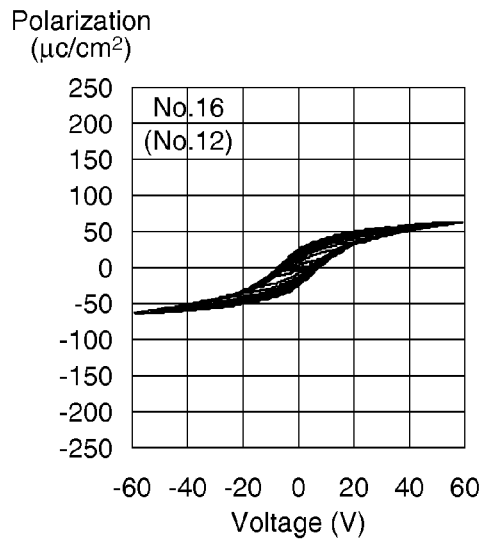
FIGS. 9A-9D are graphs showing the hysteresis characteristics of samples No. 17-No. 19.
Figure 9B:
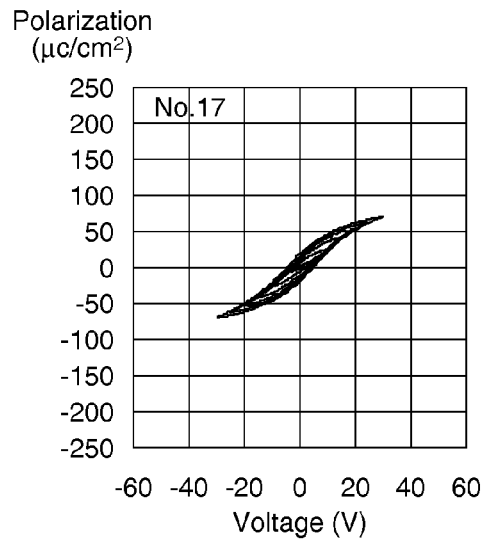
Figure 9C:
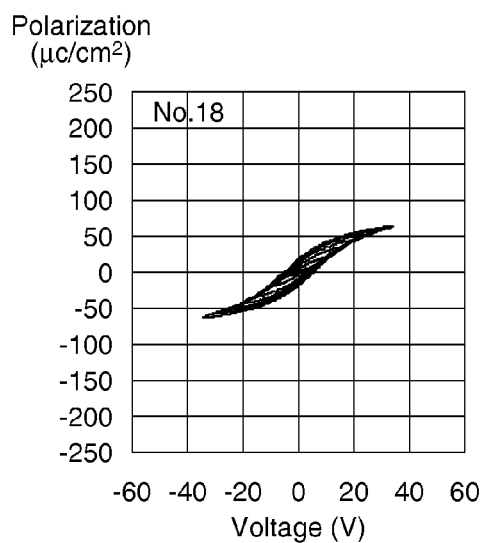
Figure 9D:
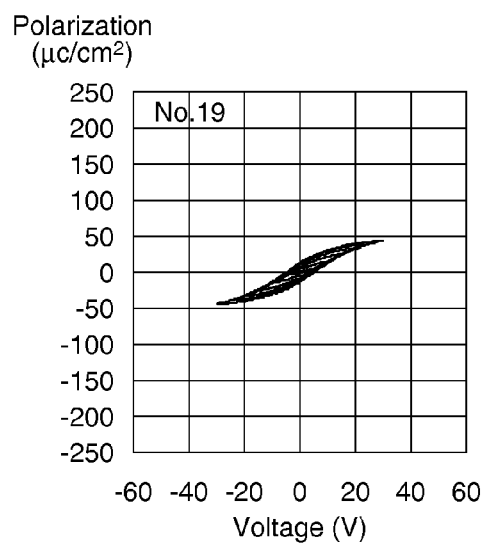

As shown in FIG. 8 through FIG. 9D, when the value u was in the range of 0-0.12, excellent hysteresis characteristics (dielectric characteristics) were obtained. However, when u=0.12, Pm at 30V was slightly lower than when u=0.08. Accordingly, it is observed that the dielectric characteristic reaches its peak when u is between 0.08 and 0.12, and good hysteresis characteristics can be obtained up to about u=0.16. However, when Zr is increased with u being greater than 0.16, the Curie temperature of $Ba(Zr, Ti)O_3$ would lower, and the hysteresis characteristic would deteriorate.

Therefore, it is understood that, as the content of Zr of $(1-x)Bi(Fe_{1-y} Mn_y)O_3-xBa(Zr_u Ti_{1-u})O_3$, the range of $0 \leq u < 0.16$ may be preferable, and the range of $0 \leq u \leq 0.12$ may be more preferable.

Next, the piezoelectric characteristics of samples No. 17-No. 19 were measured. FIG. 10 is a table showing the piezoelectric constants ($d_{33}/(pm/V)$) of the respective samples. As shown in FIG. 10, when u is in the range between 0.04 and 0.12, good piezoelectric constants could be obtained. Also, when the content of Zr is increased in the range between 0.04 and 0.12, there is a tendency that the piezoelectric constant increases.

Embodiment Example 4

Figure 11B:
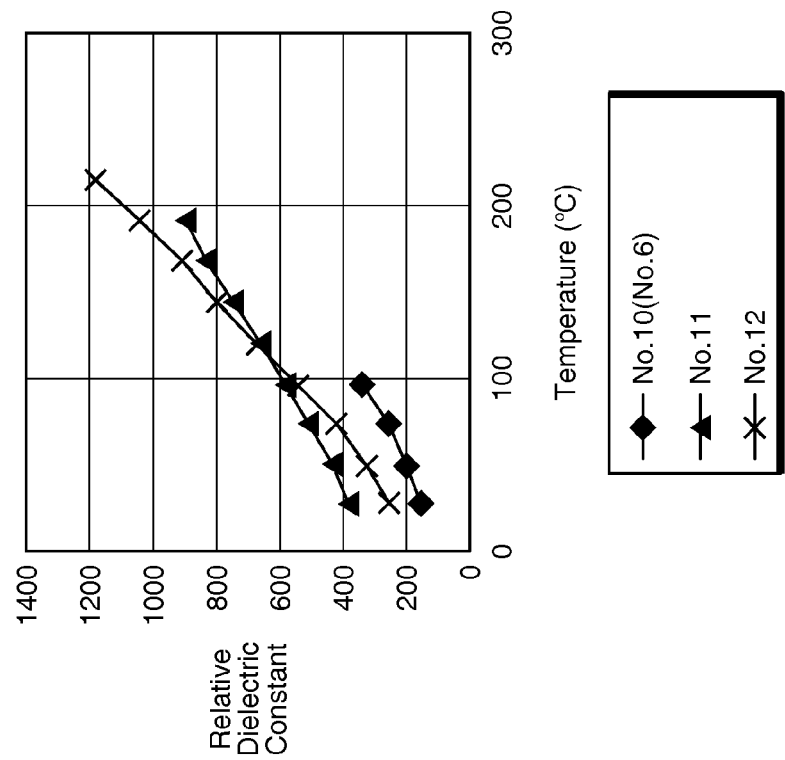
FIGS. 11A and 11B are graphs showing the relation between temperatures (° C.) and relative dielectric constants of samples No. 4-No. 8, and No. 10-No. 12.
Figure 11A:
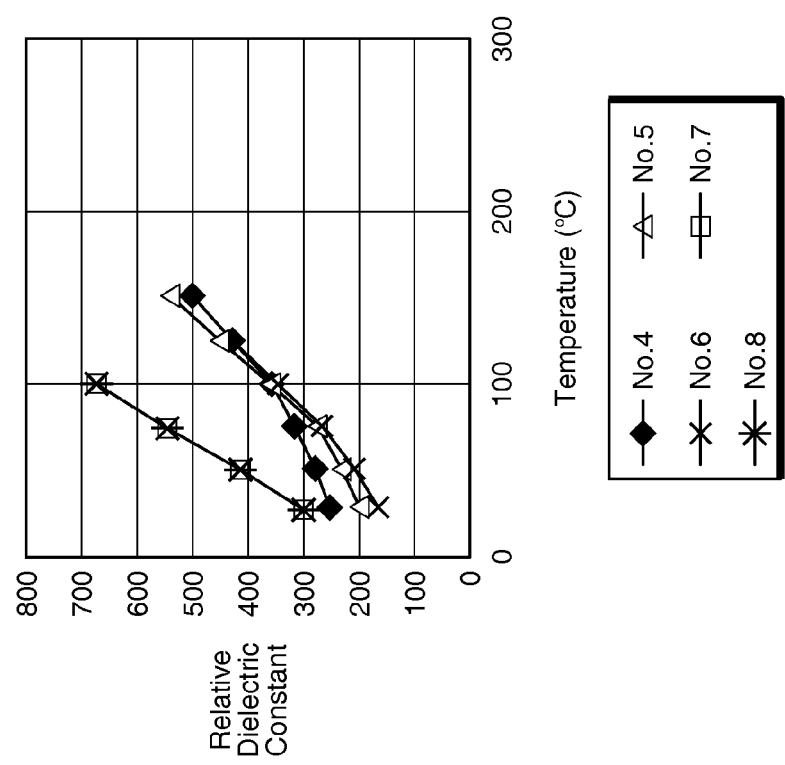

Next, to consider the Curie temperature of each of the samples, the relationship between the temperature (° C.) and the relative dielectric constant of each of the samples were examined (see FIGS. 11A and 11B).

As shown in FIG. 11A, for samples No. 4-No. 8, there was a tendency that their relative dielectric constant increased with an increase in the temperature, but an inflection point (Curie temperature) was not confirmed. A similar tendency was also observed for samples No. 10-No. 12, but an inflection point (Curie temperature) was not confirmed. Although a clear Curie temperature was not confirmed, the highest temperature plotted, for example, for samples No. 11 and No. 12, in other words, the highest temperature (heat-resisting temperature) among the temperatures at which good hysteresis characteristic was obtained was 200-225° C., which proved that the samples had high heat resisting temperatures. Moreover, samples No. 11 and No. 12 would exhibit a Curie temperature higher than at least the heat resisting temperature described above.

Figures 12, 13:
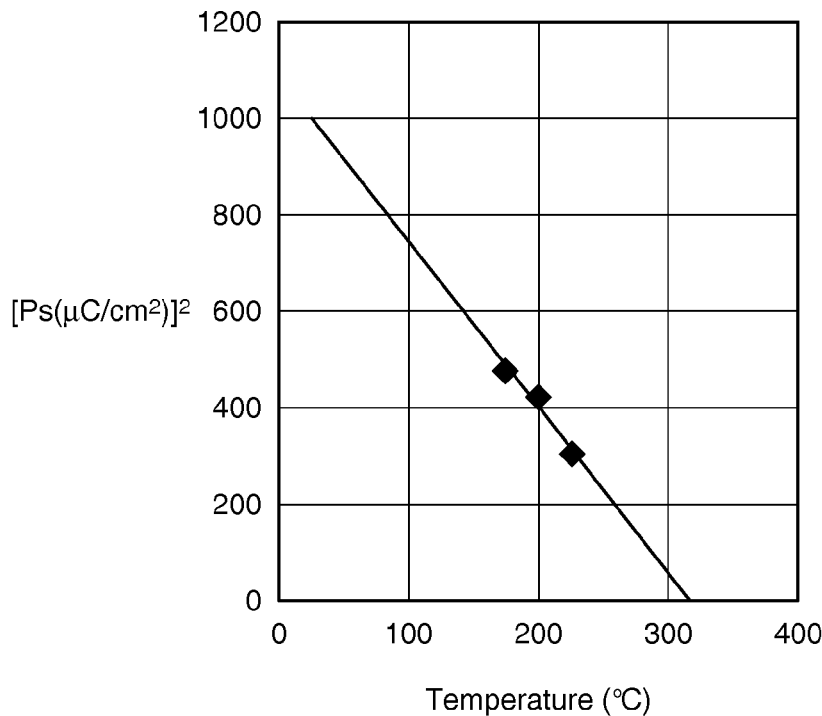
FIG. 12 is a graph showing the relation between temperatures (° C.) and squared values of spontaneous polarization Ps of sample No. 12.
FIG. 13 is a table summarizing the heat resisting temperatures of samples No. 4-No. 8, and No. 11 and No. 12 and approximated values of Curie temperatures.

To further verify the Curie temperature, the relation between temperatures (° C.) and squared values ($\mu C/cm^2$) of spontaneous polarization Ps of sample No. 12 was examined (FIG. 12). In the graph, the x-intercept can be approximated as the Curie temperature, and therefore the Curie temperature is observed to be about 320° C. In FIG. 13, heat resisting temperatures of the respective samples and approximated values of Curie temperatures are summarized. In view of the above, it is understood that the samples have high Curie temperatures, and are therefore useful.

As described above in detail, by mixing $(1-x)Bi(Fe_{1-y}Mn_y)O_3$ and $xBa(Zr_u Ti_{1-u})O_3$ in the ranges of $0<x<0.40$, $0.01<y<0.10$, and $0 \leq u<0.16$, and sintering the same, films having excellent dielectric characteristic and piezoelectric characteristic can be obtained. Also, their Curie temperatures can be improved, such that piezoelectric materials capable of enduring high-temperature use can be obtained.

In particular, by adjusting the range of the value x in the manner described above, it is possible to form piezoelectric materials having a large piezoelectric constant and a high Curie temperature, and with no loss in the characteristics caused by a layer of low dielectric constant derived from $Ba(Zr, Ti)O_3$.

Moreover, by adding Mn while adjusting the value y in the manner described above, the dielectric property of the films can be improved, and therefore the film characteristics can be improved.

Furthermore, by adding (replacing with) Zr while adjusting the value u in the manner described above, a large piezoelectric constant caused by the pinching effect can be obtained, and the Curie temperature can be maintained at a sufficiently high temperature.

It is noted that the values x, y and u described above indicate mixing mol ratios of a solution (source material solution) in which compounds of the respective elements (organometallic compounds) are dissolved in a solvent. When heat treatment is conducted at temperatures at which the vapor pressure of oxides of the respective element constituents is sufficiently small, like the present embodiment example, compounds would be formed with the mixing mole ratios described above. This phenomenon has been confirmed by using ICP (high-frequency inductively coupled plasma) emission spectrometry.

Embodiment 2

Based on the consideration made in Embodiment 1, some design guidelines to be applied at the time of forming lead free piezoelectric material shall be examined. In other words, in the case of mixing two materials, the characteristics of materials and their mixing ratios shall be examined.

First, as one material (ferroelectric material) A, a material having a spontaneous polarization of 0.5 C/m² or higher at 25° C. is selected. As another material B, a material having a relative dielectric constant of 1000 or higher at 25° C. is selected.

When the Curie temperature of the material A is Tc(A), and the Curie temperature of the material B is Tc(B), the value x is selected to establish a relation of $(1-x)Tc(A)+x\ Tc(B) \geq 300°$ C., and $100(1-x)$ % material A and $100\ x$ % material B are mixed.

Figure 14:
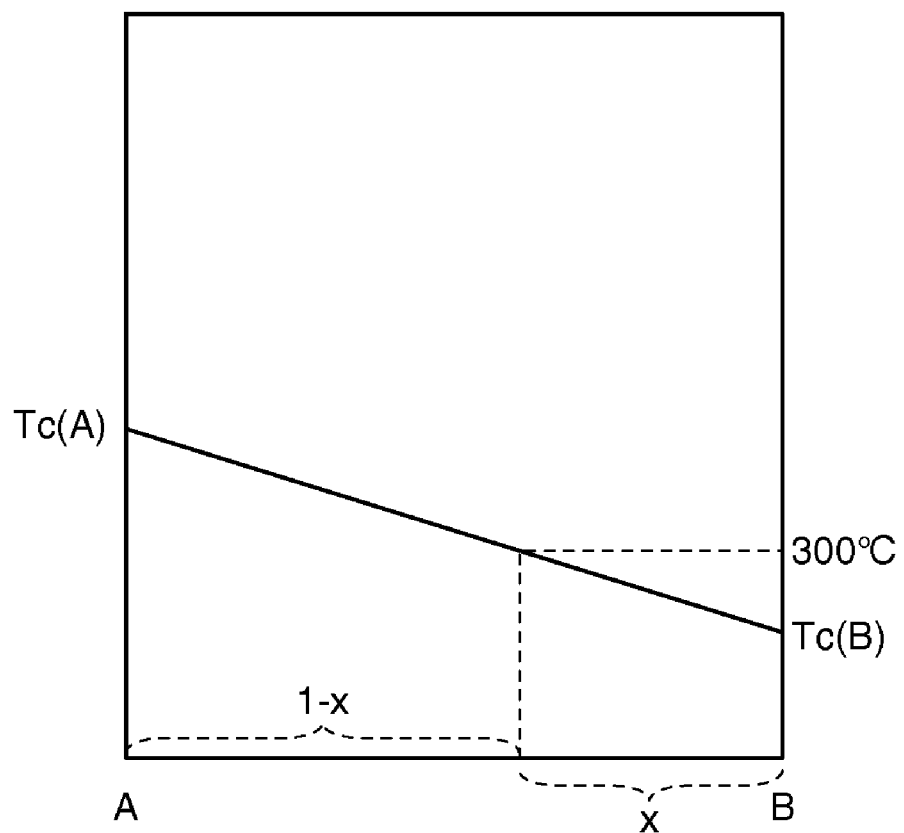
FIG. 14 is a diagram showing the relation between the mixing ratios between material A and material B and Curie temperatures.

FIG. 14 is a graph showing the relation between Curie temperatures and mixing ratios between the material A and the material B. In other words, as shown in FIG. 14, when the material A and the material B become a complete solid solution, the relation between the mixing ratio (1-x) and the Curie temperature Tc may be approximated as a linear change from Tc(A) to Tc(B). Therefore, by selecting the mixing ratio in a manner to satisfy the foregoing formula, it is believed that materials having a high Curie temperature can be obtained while making the best use of the characteristic of each of the materials mixed.

Embodiment 3

Figure 19:
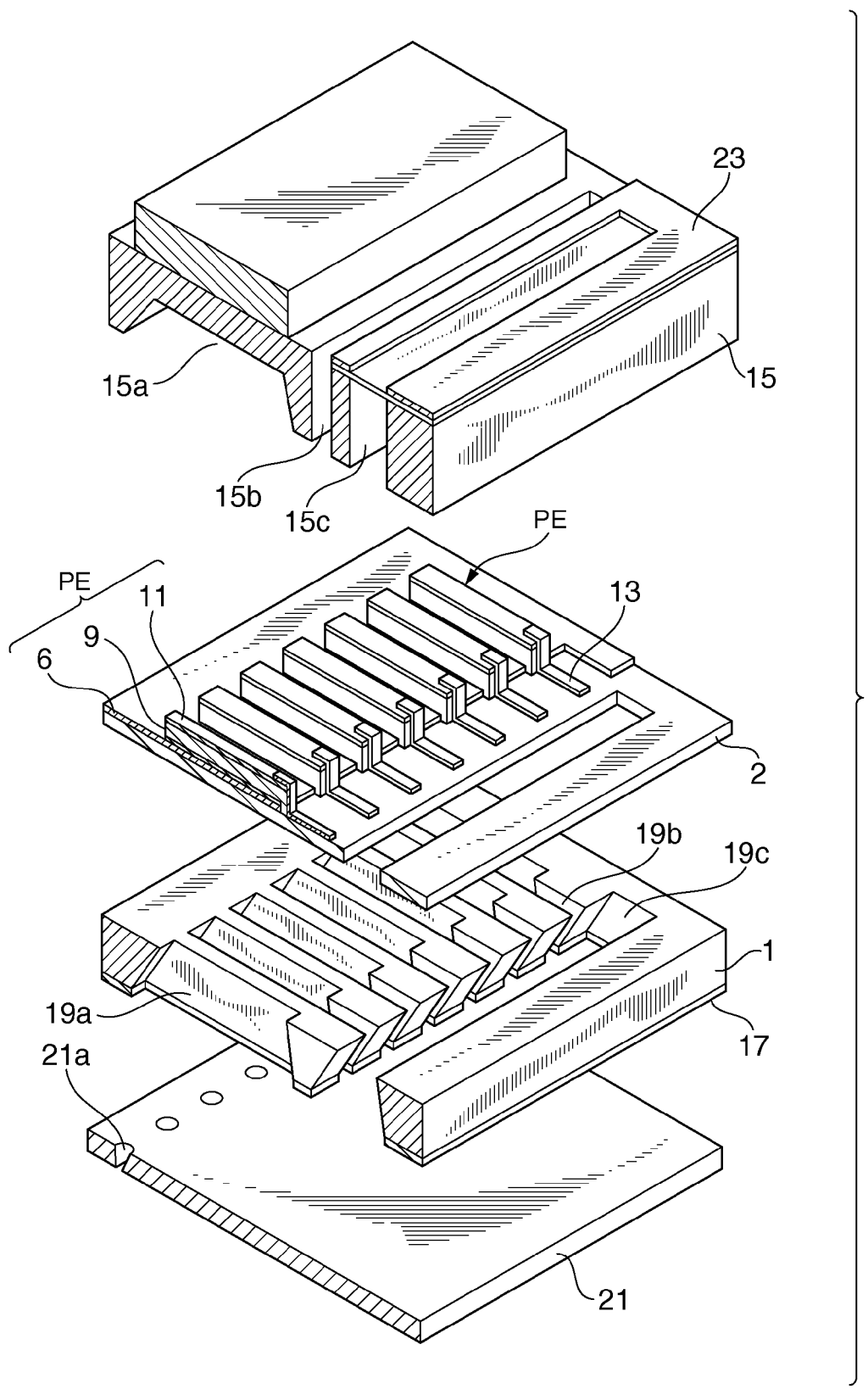
FIG. 19 is an exploded perspective view of an ink jet recording head.
Figure 20:
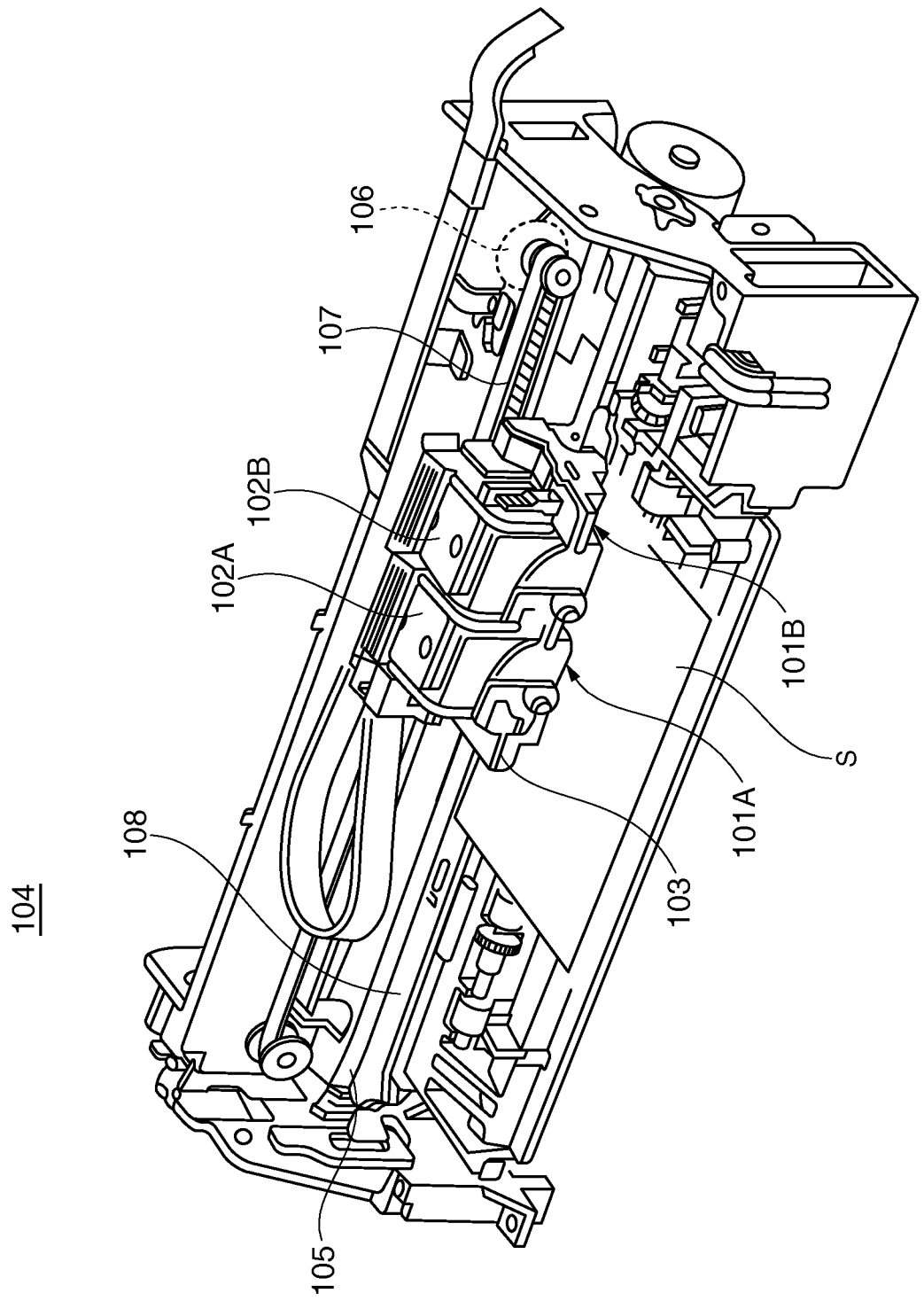
FIG. 20 is a schematic perspective view of part of an ink jet printer apparatus (a liquid jet apparatus).

A method for manufacturing a piezoelectric element that uses the piezoelectric material with excellent characteristics examined above in embodiments 1 and 2 is now described. FIGS. 15A-18B are cross-sectional views showing steps of a method for manufacturing an ink jet recording head (liquid jet head) having the piezoelectric element in accordance with the present embodiment. FIG. 19 is an exploded perspective view of the ink jet recording head. FIG. 20 is a schematic perspective view of part of an ink jet printer (a liquid jet apparatus).

With reference to FIGS. 15A-20, a method for manufacturing piezoelectric elements and the like, and their structures shall be described.

Figure 15A:
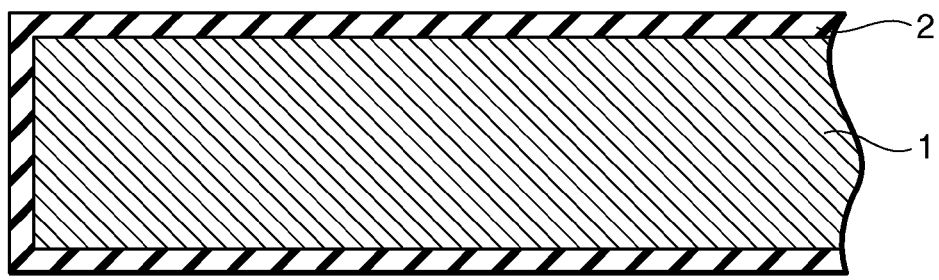
FIGS. 15A-15C are cross-sectional views showing steps of a method for manufacturing an ink jet recording head (liquid jet head) having a piezoelectric element in accordance with a third embodiment of the invention.

First, as shown in FIG. 15A, a substrate (base substrate) 1, such as, for example, a silicon (Si) substrate is prepared, and a silicon oxide film as an elastic film (vibration plate) 2 is formed on the surface of the silicon substrate 1. The silicon oxide film 2 may be formed by, for example, thermal oxidation.

Figure 15B:
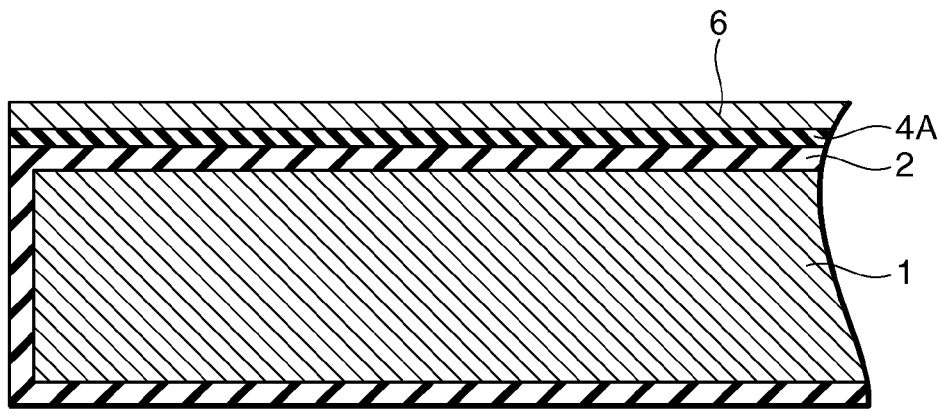
Figure 15C:
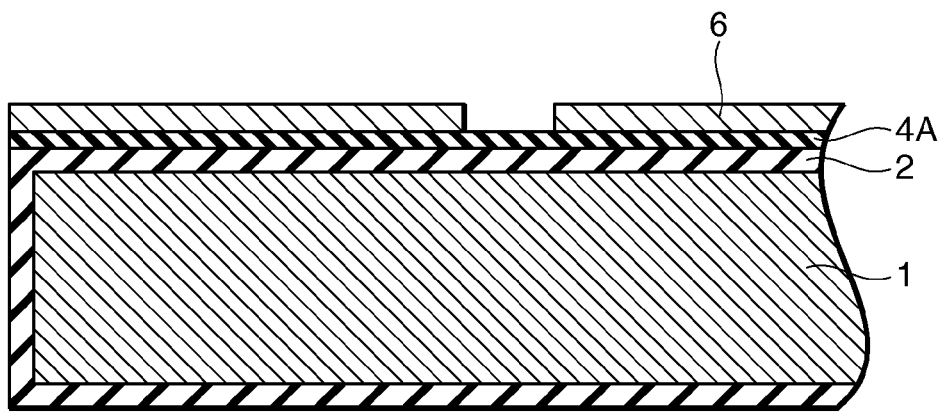

Then, as shown in FIG. 15B, a laminate film of TiAlN film/Ir film/iridium oxide film as described above, is formed on the elastic film 2. In this example, the laminate film is indicated by a reference numeral 4A.

Next, a lower electrode 6 composed of a conductive film, such as, for example, a platinum (Pt) film or the like is formed on the laminate film 4A. The Pt film may be deposited by, for example, a DC sputter method. Then, the lower electrode 6 is patterned (see FIG. 15C).

Figure 16A:
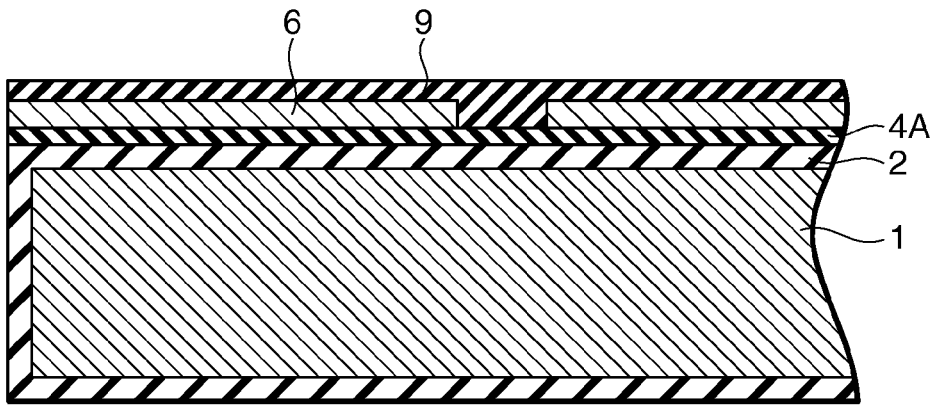
FIGS. 16A-16C are cross-sectional views showing steps of the method for manufacturing an ink jet recording head (liquid jet head) having a piezoelectric element in accordance with the third embodiment of the invention.

Next, as shown in FIG. 16A, a piezoelectric film (a piezoelectric body, a piezoelectric layer) 9 is formed on the lower electrode 6. More specifically, a source material solution with the values x, y and u adjusted as described above in embodiment 1 is coated on the substrate by an appropriate coating method, such as, a spin coat method, and then the film is heat treated (for drying, cleaning and sintering), thereby forming a piezoelectric film 9. As the material for the piezoelectric film 9, the materials described above in embodiment 2 may be used.

Figure 16B:
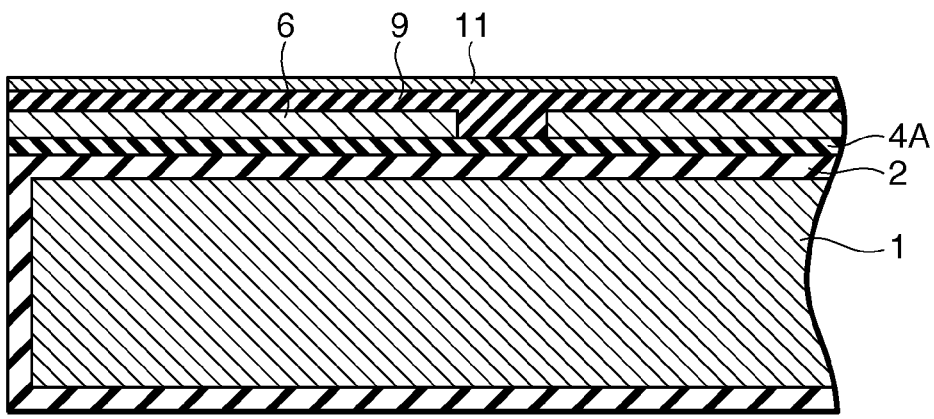
Figure 16C:
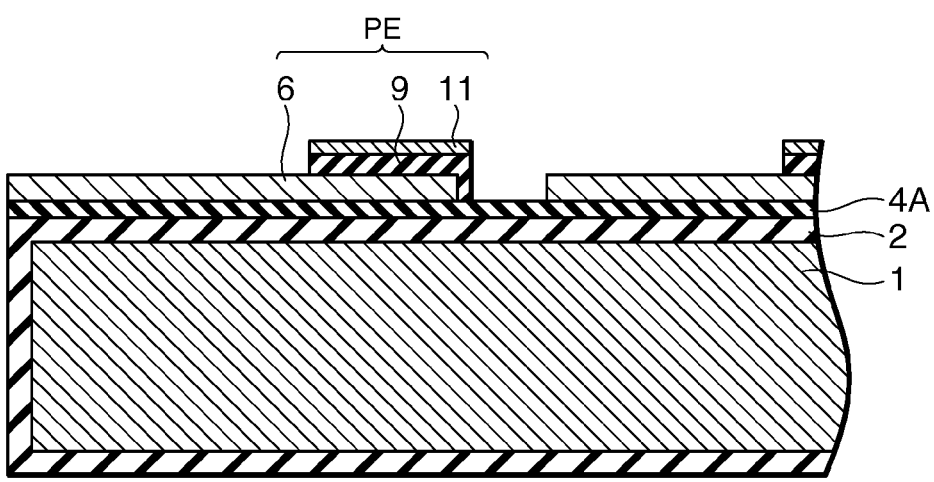

Next, as shown in FIG. 16B, a conductive film (11), such as, for example, a Pt film is deposited on the piezoelectric film 9 by a sputter method. Then, as shown in FIG. 16C, by patterning the conductive film in a desired shape, an upper electrode 11 is formed. In this instance, the piezoelectric film 9 below the conductive film may be patterned at the same time. As a result, a piezoelectric element PE made of a laminate of the lower electrode 6, the piezoelectric film 9 and the upper electrode 11 is formed.

It is noted that, as the lower electrode 6 and the upper electrode 11, a single element of metal or conductive oxide, or a laminate of layers of the foregoing materials can be used. More specifically, any one of Pt, Ir, Au, Ti, Zr, Fe, Mn, Ni, Co, $IrO_2$, $Nb:SrTiO_3$, $La:SrTiO_3$, $SrRuO_3$, $LaNiO_3$, $(La, Sr)FeO_3$, and $(La, Sr)CoO_3$, or a laminate of layers of selected ones of the aforementioned materials may be used. The metals among the above representative materials can suppress mutual diffusion with the piezoelectric material, or can suppress deterioration of the characteristics that may be caused by mutual diffusion to a minimum, as the metal is one of the constituents of the piezoelectric material. Also, the conductive oxides among the above representative materials have the same crystal structure as that of the piezoelectric material, and therefore can form cleaner electrode/piezoelectric interfaces at the time of crystal growth.

Figure 17A:
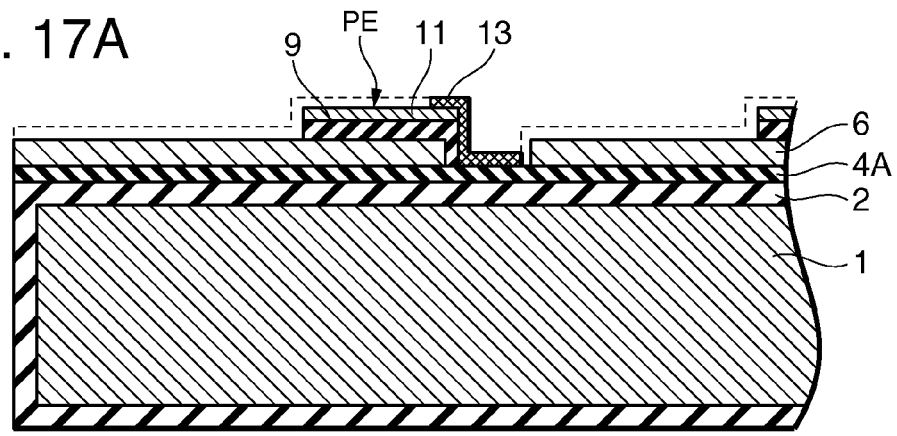
FIGS. 17A-17C are cross-sectional views showing steps of the method for manufacturing an ink jet recording head (liquid jet head) having a piezoelectric element in accordance with the third embodiment of the invention.

Next, as shown in FIG. 17A, a conductive film, such as, for example, a gold (Au) film is deposited on the piezoelectric element PE (on the upper electrode 11) by a sputter method, and patterned in a desired shape, thereby forming a lead electrode 13.

Figure 17B:
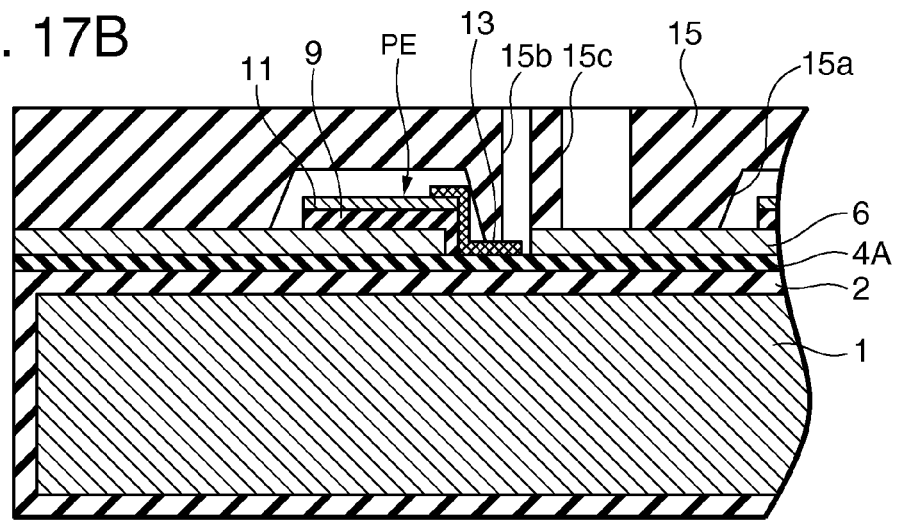

Then, as shown in FIG. 17B, a protective substrate 15 is mounted on and bonded to the piezoelectric element PE (on the substrate 1). The protective substrate 15 has a recessed section 15a in a location/portion corresponding to the piezoelectric element PE, and also has opening sections 15b and 15c.

Figure 17C:
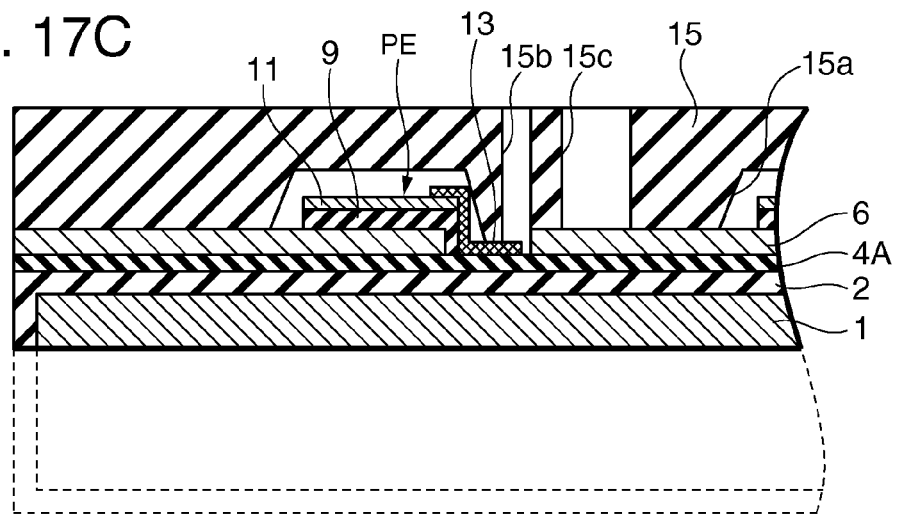

Then, as shown in FIG. 17C, the back surface of the substrate 1 (the surface on the opposite side of the surface thereof where the piezoelectric element PE is formed) is polished, and further etched by wet etching, thereby reducing the film thickness of the substrate 1.

Figure 18A:
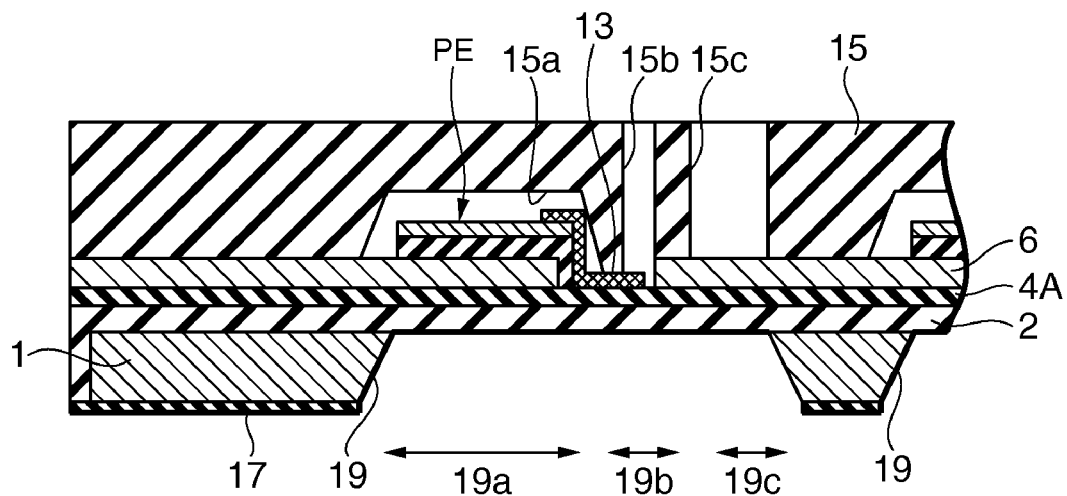
FIGS. 18A-18B are cross-sectional views showing steps of the method for manufacturing an ink jet recording head (liquid jet head) having a piezoelectric element in accordance with the third embodiment of the invention.

Then, as shown in FIG. 18A, as a mask film 17, for example, a silicon nitride film is deposited on the back surface of the substrate 1, and is patterned in a desired shape. Then, the substrate 1 is anisotropically etched, using the mask film 17 as a mask, thereby forming an opening section 19 in the substrate 1. The opening section 19 may be formed from opening regions 19a, 19b and 19c. Then, an outer circumferential area of the substrate 1 and the protective substrate 15 is removed and reshaped by dicing or the like.

Figure 18B:
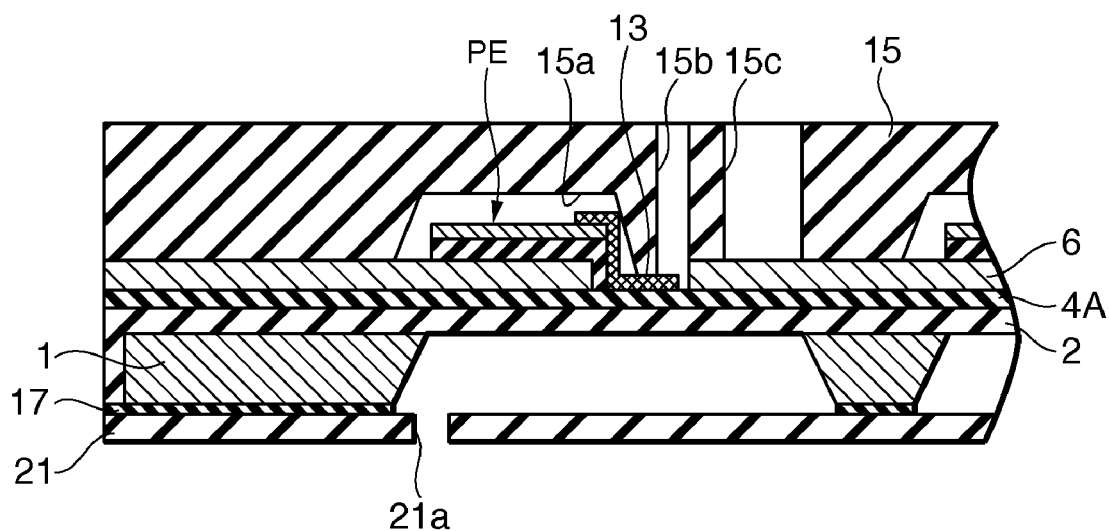

Next, as shown in FIG. 18B, a nozzle plate 21 having a nozzle aperture (nozzle opening) 21a at a position corresponding to the opening region 19a is bonded to the back surface of the substrate 1. Also, a compliance substrate 23 to be described below is bonded to the upper portion of the protective substrate 15, and appropriately divided (scribed). By the steps described above, an ink jet recording head having a plurality of piezoelectric elements PE is substantially completed.

It is noted that, as the material for the substrate 1, other materials, such as, semiconductor material other than Si, metal, ceramics, and glass may be used. Also, even when the material composing the substrate 1 has a melting point or a glass transition point, such material can endure high-temperature uses if the melting point or the glass transition point is higher than 650° C.

By using any of the materials described above in the embodiments 1 and 2 as the material for the piezoelectric film 9 in this manner, the characteristics of the piezoelectric element can be improved. In particular, as the materials are lead free, environmentally conscious product manufacturing can be conducted.

Also, lead free piezoelectric materials, which are material systems including alkali metal elements, may entail problems, such as, compositional shifts due to fallout of alkali metal elements, and diffusion into a lower electrode due to the heat at the time of crystallization. However, in addition to a high Curie temperature and a large spontaneous polarization, the materials in accordance with the embodiment described above do not contain elements, such as alkali metal elements, which would likely cause compositional shifts, and also have many more advantages, such as low crystallization temperature, such that the materials in accordance with the embodiment described above can be favorably used for piezoelectric elements.

Moreover, the compositions of the materials described above can be readily adjusted by solution processing, and the materials described above can be readily accommodated for pattern miniaturization. Accordingly, the materials in accordance with the present embodiment described above can be readily accommodated for miniaturization and higher resolution of heads and printers to be described below.

FIG. 19 is an exploded perspective view of an ink jet recording head, and sections thereof corresponding to those shown in FIGS. 15A-18B shall be appended with the same reference numbers.

As shown in the figure, each opening region 19a located below each piezoelectric element PE defines a pressure generation chamber. When an elastic film 2 is driven by the piezoelectric element PE and displaced, ink is ejected from a nozzle aperture 21a. In this embodiment, the combination of the piezoelectric element PE and the elastic film 2 is referred to as an actuator device. It is noted that FIG. 19 merely shows an example of the structure of an ink jet recording head, and it is to be understood that many appropriate changes can be made to the structure thereof, such as, the shape of each of the piezoelectric elements PE, their arrangement direction, and the like.

FIG. 20 is a schematic perspective view of part of an ink jet printer apparatus (a liquid jet apparatus) 104. As shown in the figure, the ink jet recording heads described above are assembled in jet head units 101A and 101B. Also, cartridges 102A and 102B composing ink supply devices are detachably mounted on the jet head units 101A and 101B, respectively.

Also, the jet head units 101A and 101b are mounted on a carriage 103, and attached to an apparatus main body 104. The carriage 103 is movably disposed with respect to the axial direction of a carriage shaft 105.

The driving force of a driving motor 106 is transmitted to the carriage 103 through a timing belt 107, whereby the jet head unites 101A and 101B move along the carriage shaft 105. Also, the apparatus 104 is provided with a platen 108 along the carriage shaft 105, such that a recording sheet (for example, a sheet of paper) S is transferred onto the platen 108. Ink is discharged from the jet head units 101A and 101B and printed on the recording sheet S.

It is noted that, in the embodiment described above, the ink jet recording head is described as an example. However, the invention is widely applicable to liquid jet heads, and can be used for, for example, a color material ejection head that is used for manufacturing color filters for liquid crystal displays, a liquid ejection head that is used for ejecting liquid electrode material for organic EL displays, EFDs (field emission displays) and the like, and a bioorganic material jet head used for manufacturing bio-chips.

It is noted that, in the embodiment described above, the ink jet recording head having piezoelectric elements is described as an example. However, the piezoelectric elements in accordance with the embodiment are widely applicable to ultrasonic devices such as ultrasonic oscillators, pressure sensors and the like, without being limited to those used in ink jet recording heads.

It is noted that the embodiment examples and application examples described above in accordance with the embodiments may be appropriately combined, or changed or improved depending on their use, and the invention shall not be limited to the embodiments described above. It is to be understood that embodiments according to such combinations, or modifications or improvements can be included in the scope of the invention.

What is claimed is:

1. A piezoelectric element, comprising:
   a plurality of electrodes; and
   a piezoelectric material expressed by a compositional formula of $(1-x)Bi(Fe, Mn)O_3-xBaTiO_3$ and $0<x<0.4$.

2. The piezoelectric element according to claim 1, wherein $0<x<0.3$.

3. The piezoelectric element according to claim 1, wherein $0<x<0.2$.

4. The piezoelectric element according to claim 1, wherein the piezoelectric material expressed by a compositional formula of $(1-x)Bi(Fe_{1-y}, Mn_y)O_3-xBaTiO_3$ and $0.01<y<0.1$.

5. The piezoelectric element according to claim 1, wherein the piezoelectric material expressed by a compositional formula of $(1-x)Bi(Fe_{1-y}, Mn_y)O_3-xBaTiO_3$ and $0.02<y<0.07$.

6. The piezoelectric element according to claim 1, wherein the piezoelectric material further includes zirconium.

7. The piezoelectric element according to claim 1, wherein at least one of the electrodes is platinum.

8. A liquid ejection head, comprising the piezoelectric element according to claim 1.

9. An ink jet printer, comprising the liquid ejection head according to claim 8.

* * * * *